May 28, 1957 E. L. YOUNKER 2,794,123

ELECTRICAL DELAY CIRCUITS

Filed Feb. 10, 1954 2 Sheets-Sheet 1

INVENTOR
E. L. YOUNKER
BY [signature]
ATTORNEY

ELECTRICAL DELAY CIRCUITS

INVENTOR
E. L. YOUNKER
BY James D. Falk
ATTORNEY 2,794,123

ELECTRICAL DELAY CIRCUITS

Elmer L. Younker, Madison, N. J., assignor to Bell Telephone Laboratories, Incorporated, New York, N. Y., a corporation of New York Application February 10, 1954, Serial No. 409,446

8 Claims. (Cl. 250—27)

This invention relates to electrical circuits for delaying pulses in time and more particularly to such circuits employing electronic components.

Circuits for electrically delaying pulses may be broadly divided into two groups, passive delay lines, whether of the distributed or lumped impedance type, and electronic delay circuits. Passive delay lines have inherent disadvantages including the attenuation of the pulse as it progresses along the delay line, the fact that this attenuation is generally not constant over the high frequency spectra of use of the delay line, and the large physical size of the delay line if long periods of delay are desired.

Electronic delay circuits do not have any inherent attenuation and in general can both amplify and reshape the applied pulse; the output of an electronic delay circuit may be a pulse of almost any desired amplitude, the amplitude of the output pulse being essentially independent of the amplitude of the input pulse. However, prior electronic delay lines have had built into them the time constant which determines the period of delay. Thus, they have not been flexible enough to handle pulses of varying lengths or to delay these pulses for varying periods of time.

In certain electrical systems, the information is transferred between components of the system in the form of coded pulses wherein the pulse length identifies and determines the information. When it is desired to delay an information message in such a system, it is necessary that the pulses of varying lengths all be delayed for the same time interval. In such systems, the repetition rate of the coded pulses may be quite low. Prior electronic circuits, having a predetermined period of delay incorporated into the circuit itself, are dependent on a constant pulse length to attain the proper relationship between the commencement of each of the delayed pulses. Electrical delay lines can handle pulses of varying lengths but are subject to all the disadvantages referred to above.

It is a general object of this invention to provide an improved electronic delay circuit.

It is another object of this invention to provide an electronic delay circuit which may readily delay pulses of varying lengths for a predetermined interval and which can delay pulses whose length may be greater than the delay time as well as pulses whose length may be shorter than the delay time.

It is a further object of this invention to provide an electronic delay circuit in which the delay pulses are not only reshaped and amplified but may be of a duration either longer or shorter than the applied pulses.

It is a still further object of this invention to provide an electronic delay circuit in which the duration of the delay may be readily varied during the employment or operation of the circuit in its associated system.

These and other objects of this invention are attained in one specific illustrative embodiment wherein the pulse to be delayed is applied to a differentiator and separator circuit that differentiates the leading and trailing edges of the applied pulses and separates the positive and negative pulses resulting from this differentiation. The differentiated pulse generated by the leading edge of the input pulse is applied to a leading edge activated monostable multivibrator and the differentiated pulse generated by the trailing edge is applied to a trailing edge activated monostable multivibrator.

The first multivibrator is thus triggered in response to the leading edge of the pulse to be delayed, and the second multivibrator is triggered in response to the trailing edge of the pulse to be delayed. A bistable multivibrator is triggered on return of each of the monostable multivibrators to their normal or stable states, and the reshaped, amplified, and delayed pulse appears at the output of the bistable multivibrator.

The length of the delay is determined by the period of the monostable multivibrators, and, if the two monostable multivibrators have equal periods, the length of the output or delayed pulse will be the same as the length of the input pulse. As the two monostable multivibrators are triggered by the leading and trailing edges of the applied pulse, the duration or length of the applied pulse is immaterial and, therefore, the circuit will delay with equal facility pulses of any length; however, the period between pulses should not be shorter than the period of the delay.

Therefore, by providing that the periods of the monostable multivibrators are equal, the output of the bistable multivibrator is a pulse of the same duration or length as the applied pulse. However, the periods of the two monostable multivibrators need not be equal, in which case the length of the output pulse is increased or decreased by a predetermined and constant amount which corresponds to the difference between the periods of the two monostable multivibrators. Additionally, by varying the capacitances in the leading and trailing edge multivibrators which control the time constants of the multivibrators, the period or length of the delay may be facilely varied during the employment or operation of the circuit in an electrical system.

It is a feature of this invention that an electronic delay circuit include a pair of monostable multivibrator circuits triggered by the leading and trailing edges, respectively, of the applied pulse and a bistable multivibrator triggered on the return of each of the monostable multivibrators to their normal states.

It is a further feature of this invention that the pulse to be delayed be applied to a differentiator and separator circuit which differentiates the leading and trailing edges of the applied pulse and applies a differentiated pulse of one polarity to one of the monostable multivibrators and a differentiated pulse of the opposite polarity to the other of the monostable multivibrators.

It is a further feature of certain embodiments of this invention that the periods of the first and second monostable multivibrators are equal whereby the reshaped, amplified, and delayed pulse appearing at the output of the bistable multivibrator will be of the same length as the applied or input pulse.

It is a further feature of certain other embodiments of this invention that the periods of the two monostable multivibrators are different so that the output of the bistable multivibrator is a pulse of a different length than the input pulse, the difference being determined by the difference between the periods of the two monostable multivibrators.

It is a still further feature of certain embodiments of this invention that each monostable multivibrator include a variable timing capacitor which determines the duration of the period of the multivibrator so that the delay between the input pulse and the output of the bistable multivibrator can be varied as well as the duration of the output pulse.

A complete understanding of this invention and of these and various other desirable features thereof may be gained from the following detailed description and the accompanying drawing, in which.

Figure 1:
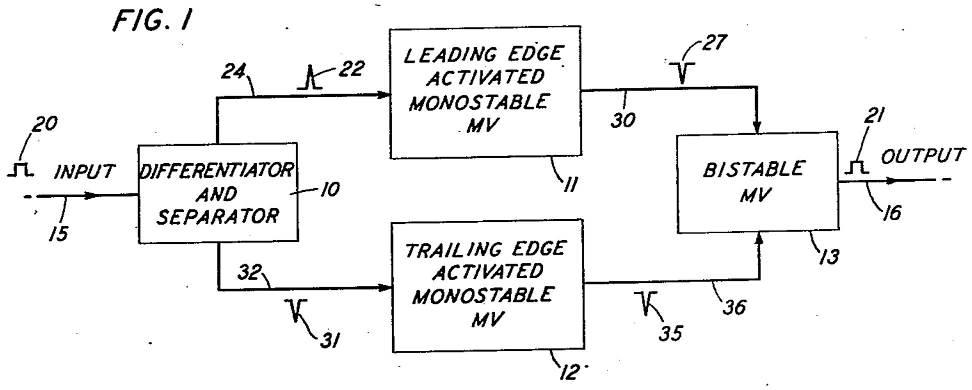
Fig. 1 is a representation in block diagram form of one specific illustrative embodiment of this invention.

Turning now to the drawing, one specific illustrative embodiment of this invention is depicted in block diagram form in Fig. 1 and comprises a differentiator and separator circuit 10, a leading edge activated monostable multivibrator 11, a trailing edge activated multivibrator 12, and a bistable multivibrator 13. The pulse 20 to be delayed is applied to an input lead 15, and the delayed pulse 21 appears at the output lead 16.

Figure 2:
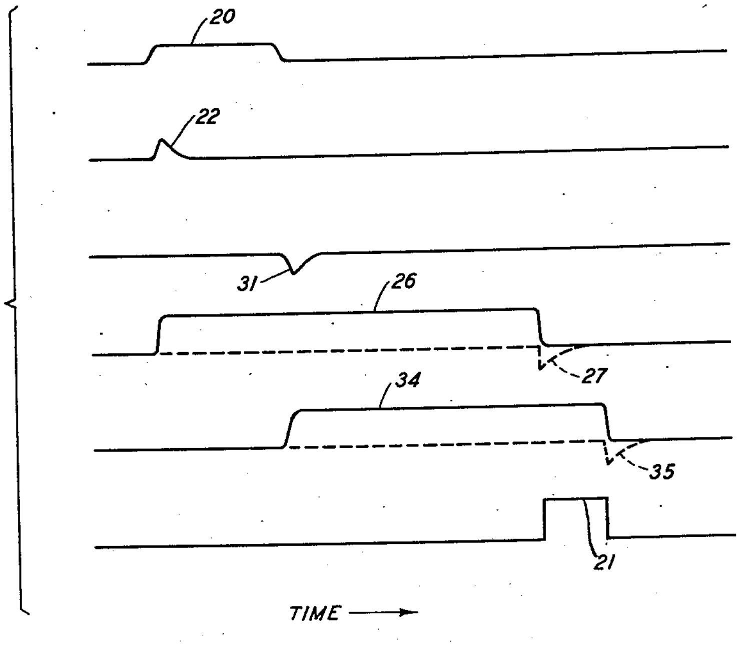
Fig. 2 is a time chart for various pulses and voltages at different points in the embodiment of Fig. 1.

The operation of this specific embodiment of the invention can be readily understood from the time diagram of Fig. 2 for the various voltages and pulses appearing on the leads of the circuit of Fig. 1. The pulse 20 to be delayed is applied to the differentiator and separator circuit 10. The circuit 10 generates a pulse 22 in response to the leading edge of pulse 20 and applies that pulse through a lead 24 to the leading edge activated monostable multivibrator 11. This pulse 22 trips the multivibrator 11.

In accordance with an aspect of this invention, the period of the monostable multivibrator 11 determines the desired delay. As this period is independent of and not related to the length of the pulse 20 to be delayed, it is obvious that in circuits in accordance with this invention, the period of delay may be either smaller than or larger than the length of the pulse being delayed. Further, by varying this period, the length of the delay may readily be varied.

The output of the multivibrator 11 is a voltage 26. However, this output is advantageously differentiated so that it is only the trailing edge of the voltage pulse 26 which is utilized to trip the bistable multivibrator 13. Thus, a pulse 27 generated in response to this trailing edge is applied over lead 30 to the bistable multivibrator. At the end of the delay period, which is the end of the period that the multivibrator 11 is tripped, the bistable multivibrator is tripped and the voltage output appearing on lead 16, therefore, changes and, in this embodiment, goes positive to begin to repeat the initially applied positive pulse 20.

A pulse 31 is obtained by the differentiator and separator circuit 10 from the trailing edge of the input pulse 20 and applied over lead 32 to the trailing edge activated monstable multivibrator circuit 12. If it is desired to produce a delayed output pulse 21 identical with the applied pulse 20, then the period of multivibrator 12 is equal to that of multivibrator 11 and is, in fact, the length of the delay. However, it is apparent that a circuit in accordance with this embodiment of the invention affords a good deal of flexibility and that the circuit not only delays and reshapes the applied pulse but may also change its duration by a specified amount, if desired. Thus, if it is desired that the input pulse be repeated after a given period of delay but be compressed in duration, the period of the multivibrator circuit 12 will be less than the period of the multivibrator circuit 11; conversely, if it is desired to expand the pulse, the period of the trailing edge multivibrator 12 will be longer than the period of the leading edge multivibrator 11. Circuits in accordance with this invention may therefore be utilized to both delay and compress or expand applied pulses.

When the differentiated pulse 31 is applied to the trailing edge monostable multivibrator 12, the output of the multivibrator 12 assumes a voltage value 34. However, again this output is advantageously differentiated so that the trailing edge of the voltage pulse 34 generates a pulse 35 which is applied over lead 36 to trip the bistable multivibrator 13 and terminate the output pulse 21.

As can be seen in the time diagram of Fig. 2, a circuit in accordance with this invention not only delays the applied pulse, but also amplifies and reshapes the pulse. Further, while this circuit has been described with reference to a synchronous operation, in synchronous operation the output pulse 21 can also be retimed by merely introducing synchronizing signals into the monostable multivibrators 11 and 12 so that the trailing edges of the voltage pulses 26 and 34 are synchronized.

It is desirable that the time between successive pulses applied to a circuit in accordance with this embodiment of the invention be not less than the period of the delay, i. e., the period of the multivibrator 11; if a second input pulse is applied before the voltage output 26 from the multivibrator 11 has returned to its normal value so that the trailing edge of the voltage pulse 26 can generate the pulse 27, the bistable multivibrator 13 will not be triggered and the first input pulse will be lost in the circuit, no corresponding pulse appearing at the output lead 16. Further a short time is required to allow for stabilization of the multivibrators.

Figure 3:
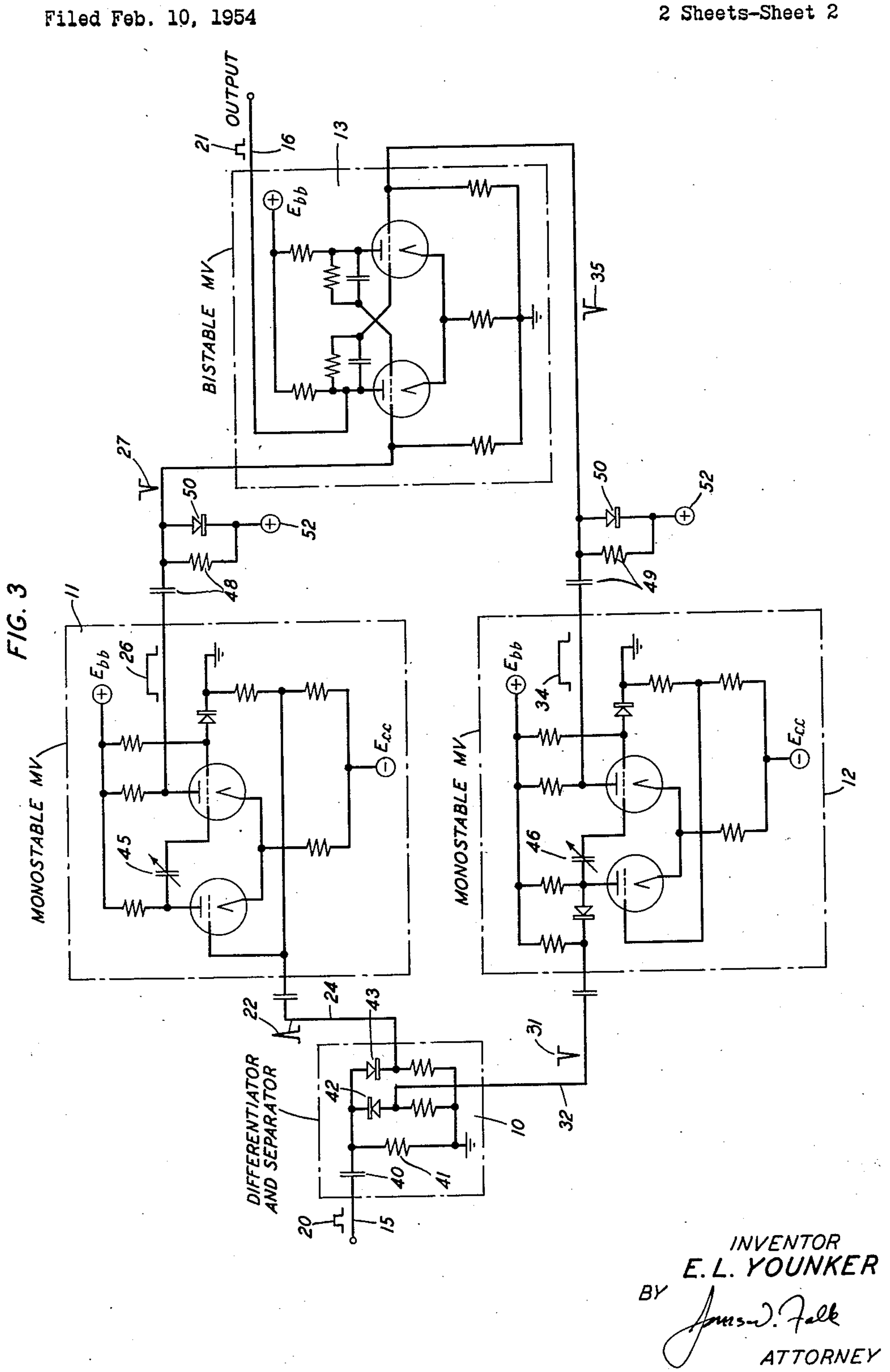
Fig. 3 is a circuit schematic representation of one specific embodiment in accordance with the embodiment of Fig. 1.

Turning now to Fig. 3, there is depicted a schematic representation of one circuit in accordance with the embodiment of Fig. 1. The differentiator and separator circuit 10 comprises a capacitor 40 and resistor 41 to attain differentiation of the leading and trailing edges of the input pulse 20 and a pair of oppositely poled unidirectional circuit elements 42 and 43 to direct the positive pulse 22 to the leading edge activated monostable multivibrator 11 and the negative pulse 31 to the trailing edge activated monostable multivibrator circuit 12.

Each of the monostable multivibrators may be of types known in that art in which the period of the multivibrator is determined by capacitors 45 and 46. As mentioned above, it is an aspect of this invention that these capacitors may be variable so that either the period of the delay or the length of the output pulse may be varied. If it is desired only to vary the period of the delay but to have the output pulse 21 of the same duration as the applied pulse 20, the two capacitors 45 and 46 are advantageously identical and ganged together so that their capacitances may be changed simultaneously and equally. They may be mechanically ganged, or the variations may be attained by employing condensers whose capacitances may be changed in response to an electrical variation, as is known in the art. However, if it is desired to be able to vary the length of the output pulse 21, either one or both of the condensers 45 and 46 may be varied independently of the other.

The output voltages 26 and 34 of the multivibrators 11 and 12 are applied to differentiation circuits 48 and 49, respectively, where the trailing edges of the voltage pulses 26 and 34 generate negative pulses 27 and 35, respectively. The positive pulses arising from the leading edges of the pulses 26 and 34 are advantageously eliminated by clipper circuits comprising the unidirectional current elements 50 connected to a voltage source 52 which should be positive and approximately equal to the more positive of the two stable state grid voltages. Voltage source 52 should not be negative with respect to this grid voltage. The pulses 27 and 35 are applied to the control grids of the tubes of the bistable multivibrator circuit 13 to the plate of one of which the output lead 16 is connected.

It is to be understood that the above-described arrangements are illustrative of the application of the principles of the invention. Numerous other arrangements may be devised by those skilled in the art without departing from the spirit and scope of the invention.

What is claimed is:

1. An electrical circuit for delaying a pulse a predetermined interval of time comprising a first and a second monostable multivibrator, the period of said first monostable multivibrator corresponding to the predetermined interval of delay and the period of said second monostable multivibrator determining the width of the delayed pulse, means for triggering said first monostable multivibrator on occurrence of the leading edge of an input pulse, means for triggering said second monostable multivibrator on occurrence of the trailing edge of said input pulse, a bistable multivibrator, and means for triggering said bistable multivibrator on return of said first and second monostable multivibrators to their stable states, whereby the output of said bistable multivibrator is a pulse delayed by the period of said first monostable multivibrator from the input pulse.

2. An electrical circuit in accordance with claim 1 wherein said means for triggering said first monostable multivibrator and means for triggering said second monostable multivibrator comprise a differentiation circuit, means for applying an input pulse to said differentiation circuit and unidirectional current elements for applying the outputs of said differentiation circuit of one polarity to one of said monostable multivibrators and of the other polarity to the other of said monostable multivibrators.

3. An electrical circuit in accordance with claim 1 wherein the periods of said first and second monostable multivibrators are equal, thereby producing at the output of said bistable multivibrator a pulse of the same length as the input pulse.

4. An electrical circuit in accordance with claim 1 wherein the period of said second monostable multivibrator is of different duration than the period of said first monostable multivibrator so that the output of said bistable multivibrator is of a length different from the input pulse by the amount of the difference between the periods of said first and second monostable multivibrators.

5. An electrical circuit in accordance with claim 1 wherein each of said monostable multivibrators includes a capacitance for determining the duration of the period of said monostable multivibrator, said capacitances being variable to vary the delay between the input pulse and the pulse at the output of said bistable multivibrator and to vary the width of said output pulse.

6. An electronic delay circuit comprising a first and a second monostable multivibrator, the periods of said multivibrators being equal, a differentiation circuit, means applying an input pulse to said differentiation circuit, unidirectional circuit elements for applying the outputs of said differentiation circuit of one polarity to one of said monostable multivibrators and of the other polarity to the other of said monostable multivibrators, a bistable multivibrator, and means for triggering said bistable multivibrator on return of said first and second monostable multivibrators to their stable states, whereby the output of said bistable multivibrator is a pulse delayed from said input pulse by the period of said first of said monostable multivibrators.

7. An electronic delay circuit in accordance with claim 6 wherein each of said monostable multivibrators includes a capacitance for determining the duration of the period of said monostable multivibrators, said capacitances being variable to vary the delay between the leading and trailing edges of the input pulse and the leading and trailing edges of the pulse at the output of said bistable multivibrator.

8. An electronic delay circuit comprising a pair of monostable multivibrators, means for triggering one of said multivibrators on occurrence of the leading edge of a pulse to be delayed, means for triggering the other of said multivibrators on occurrence of the trailing edge of a pulse to be delayed, a bistable multivibrator, and means connecting each of said monostable multivibrators to said bistable multivibrator to trigger said bistable multivibrator on return of said monostable multivibrators to their stable states.

References Cited in the file of this patent

UNITED STATES PATENTS

| | | |
|---|---|---|
| 2,402,916 | Schroeder | June 25, 1946 |
| 2,402,917 | Miller | June 25, 1946 |
| 2,498,659 | De Rosa | Feb. 28, 1950 |
| 2,599,206 | Smith | June 3, 1952 |